US012785703B2

(12) United States Patent
Luo et al.

(10) Patent No.: US 12,785,703 B2
(45) Date of Patent: Nov. 3, 2026

(54) SAMPLING FRACTIONAL-N PHASE-LOCKED LOOP WITH FEEDBACK SPUR COMPENSATION

(71) Applicant: Intel Corporation, Santa Clara, CA (US)

(72) Inventors: Hao Luo, Milpitas, CA (US); Somnath Kundu, Hillsboro, OR (US); Brent R. Carlton, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 116 days.

(21) Appl. No.: 17/970,477

(22) Filed: Oct. 20, 2022

(65) Prior Publication Data

US 2024/0137029 A1 Apr. 25, 2024
US 2024/0235561 A9 Jul. 11, 2024

(51) Int. Cl.
*H03L 7/099* (2006.01)
*H03L 7/093* (2006.01)

(52) U.S. Cl.
CPC ............ *H03L 7/0992* (2013.01); *H03L 7/093* (2013.01); *H03L 2207/50* (2013.01)

(58) Field of Classification Search
CPC . H03L 7/093; H03L 7/085; H03L 7/08; H03L 7/06; H03L 7/00
See application file for complete search history.

(56) References Cited

U.S. PATENT DOCUMENTS 9,197,403 B2 * 11/2015 Gauthier ............... H04L 7/0331
9,735,670 B2 * 8/2017 Wu ....................... H02M 1/143
10,367,464 B2 * 7/2019 Salle ................... H03C 3/0908

OTHER PUBLICATIONS

Wu et al., "A 14nm Analog Sampling Fractional-N PLL with a Digital-to-Time Converter Range-Reduction Technique Achieving 80fs Integrated Jitter and 93fs at Near-Integer Channels," 2021 IEEE International Solid-State Circuits Conference (ISSCC), Feb. 2021, 3 pages.

He et al., "A 673μW 1.8-to-2.5GHz Dividerless Fractional-N Digital PLL with an Inherent Frequency-Capture Capability and a Phase-Dithering Spur Mitigation for IoT Applications," 2017 IEEE International Solid-State Circuits Conference (ISSCC), Feb. 2017, 3 pages.

(Continued)

*Primary Examiner* — Menatoallah Youssef

(74) *Attorney, Agent, or Firm* — Schwabe, Williamson & Wyatt, P.C.

(57) ABSTRACT

Embodiments herein relate to a sampling phase-locked loop (PLL) with a compensation circuit for reducing ripples due to the use of a fractional N divider. The compensation circuit includes a ripple amplifier and a ripple divider. The ripple amplifier receives an output voltage, Vmain, of a main sampling circuit of the PLL and amplifies its alternating current (AC) components. The amplified output voltage is provided to a ripple integrator which samples the minimum and maximum values to provide inputs to an operational amplifier (op amp). An output of the op amp is fed back to a digital-to-analog converter (DAC), which provides a corresponding compensation voltage, Vcomp. Vcomp is added to Vmain to provide a final output control voltage, Vctrl, to control a voltage-controlled oscillator (VCO) of the PLL.

19 Claims, 8 Drawing Sheets

(56) References Cited

OTHER PUBLICATIONS

Liao et al., "A 7.7~10.3GHz 5.2mW-247.3dB-FOM Fractional-N Reference Sampling PLL with 2nd Order CDAC Based Fractional Spur Cancellation In 45nm CMOS," 2020 IEEE Custom Integrated Circuits Conference (CICC), Mar. 2020, 4 pages.
Kundu et al., "A 2-to-2.48GHz Voltage-Interpolator-Based Fractional-N Type-I Sampling PLL in 22nm FinFET Assisting Fast Crystal Startup," 2022 IEEE International Solid-State Circuits Conference (ISSCC), Feb. 2022, 3 pages.

* cited by examiner

SAMPLING FRACTIONAL-N PHASE-LOCKED LOOP WITH FEEDBACK SPUR COMPENSATION

FIELD

The present application generally relates to the field of circuits, and more specifically, to a phase-locked loop.

BACKGROUND

A phase-locked loop (PLL) is a fundamental component of many circuits. A PLL receives an input clock signal and uses it to provide output a clock signal, typically at a higher frequency than the frequency of the input clock signal. Various applications of PLLs include demodulation of frequency-modulated (FM) and amplitude-modulated (AM) signals, use within a frequency synthesizer, signal recovery and in the distribution of precisely timed clock pulses in digital logic circuits and system, such as within a microprocessor system. However, various challenges are presented in providing a PLL with a stable clock output.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
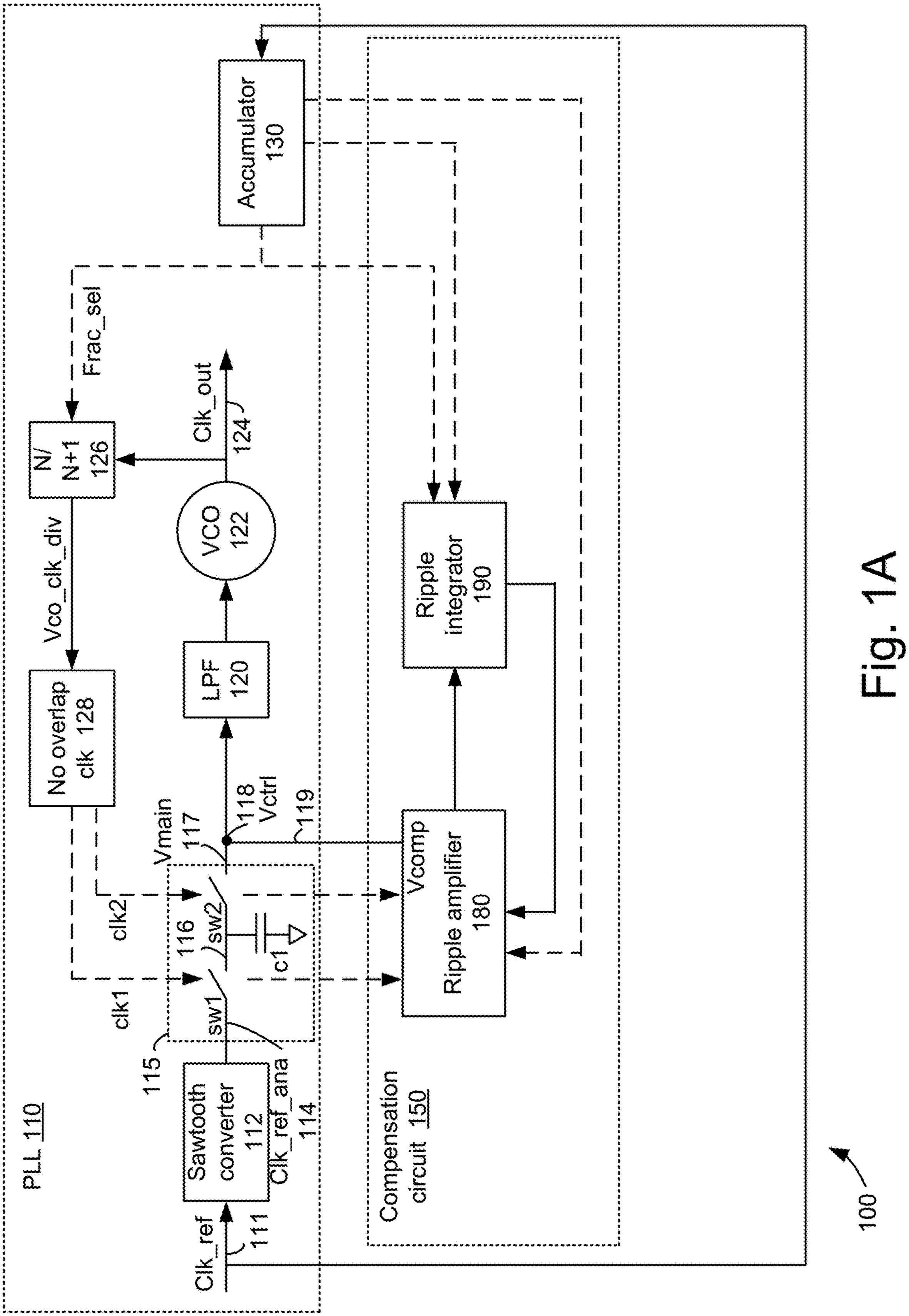
FIG. 1A depicts an example circuit 100 which includes a phase-locked loop (PLL) 110 and a compensation circuit 150, in accordance with various embodiments.

As mentioned at the outset, various challenges are presented in providing a phase-locked loop (PLL) with a stable clock output. PLLs are widely used in many systems for clock generation. The clock from a voltage controlled oscillator (VCO) inside the PLL is compared with a reference clock to generate a control signal for the VCO. Moreover, in a fractional PLL, the VCO's clock frequency has a certain ratio relative to a frequency of the reference clock, where the ratio is determined by a frequency divider.

A PLL may be configured as a sampling PLL which uses the divided VCO's clock to sample the reference clock to generate the VCO control signal. The ratio is controlled by a clock divider, which divides the VCO clock before comparing it with the reference clock. If the ratio is not an integer, it requires the divider to have multiple moduli, usually N or N+1. An effective non-integer (fraction N) ratio can be achieved through adjusting the duration for the N state or N+1 state. However, when a transition between these two states happens, the sampling clock (divided from the VCO clock) has a phase jump relative to the reference clock. This causes a ripple in the sampled control voltage, thereby generating large spurs in the VCO's clock. This downgrades the quality of the clock signal which is output from the PLL. A spur refers to an unwanted tone in the spectrum.

One possible solution is to use a very narrow bandwidth low pass filter to remove the ripple and smooth the VCO control signal. However, this solution can result in a long capture response time or even stability issues.

Another possible solution involves a Digital to Time Converter (DTC) to adjust the phase of the reference clock so that the sampling clock can always be aligned with the adjusted reference clock. The ideal sampled control voltage will be flat and the spur is cancelled. However, the DTC's linearity is a difficult challenge and it requires calibration.

Another possible solution uses phase dithering to mitigate the spur. It disperses out the spur's energy to a much wider bandwidth. However, it may raise the noise floor, and the control of dithering is complex.

Another possible solution uses Control Digital-to-Analog Converter (CDAC) modules to generate an analog voltage corresponding to the digital inputs. The voltage can be used as a reference source for comparators or can be used as an offset to an operational amplifier (op amp) to add a compensation voltage to the sampled signal. It also need a second order CDAC for quantization error. However, the compensation DAC's reference voltage needs careful calibration and requires a complex mechanism such as a background least-mean-square (LMS) process to generate.

Another possible solution uses two CDACs to sample the reference clock to generate the control signal. The weight of each CDAC's sample is adjustable. The weight of one CDAC is linearly decreased while the weight of the other CDAC is increased. Ideally, the combined sampling is a flat control signal and the VCO clock will be spur free. However, the compensation requires two CDAC to be matched. It also needs a complex control logic to control two consecutive high speed samplings.

The techniques discloses herein address the above and other issues. In one aspect, a proposed architecture for a sampling PLL uses one digital-to-analog converter (DAC) to compensate the sampling control signal. A ripple integrator is also used to sense the ripple in the control signal and provide a corresponding negative feedback to the DAC. The negative feedback will automatically adjust the compensation amplitude so that the VCO control signal is ideally flat and the VCO clock is spur free.

A number of advantages can be achieved. For example, the sampling PLL has low noise and low power. Additionally, it does not sacrifice the capture bandwidth of the PLL.

Further, the solution eliminates the requirement of two matching DACs, does not require calibration, and does not require two consecutive high speed samplings, thereby significantly simplifying the control logic and reducing power.

These and other features will be further apparent in view of the following discussion.

Figure 2A:
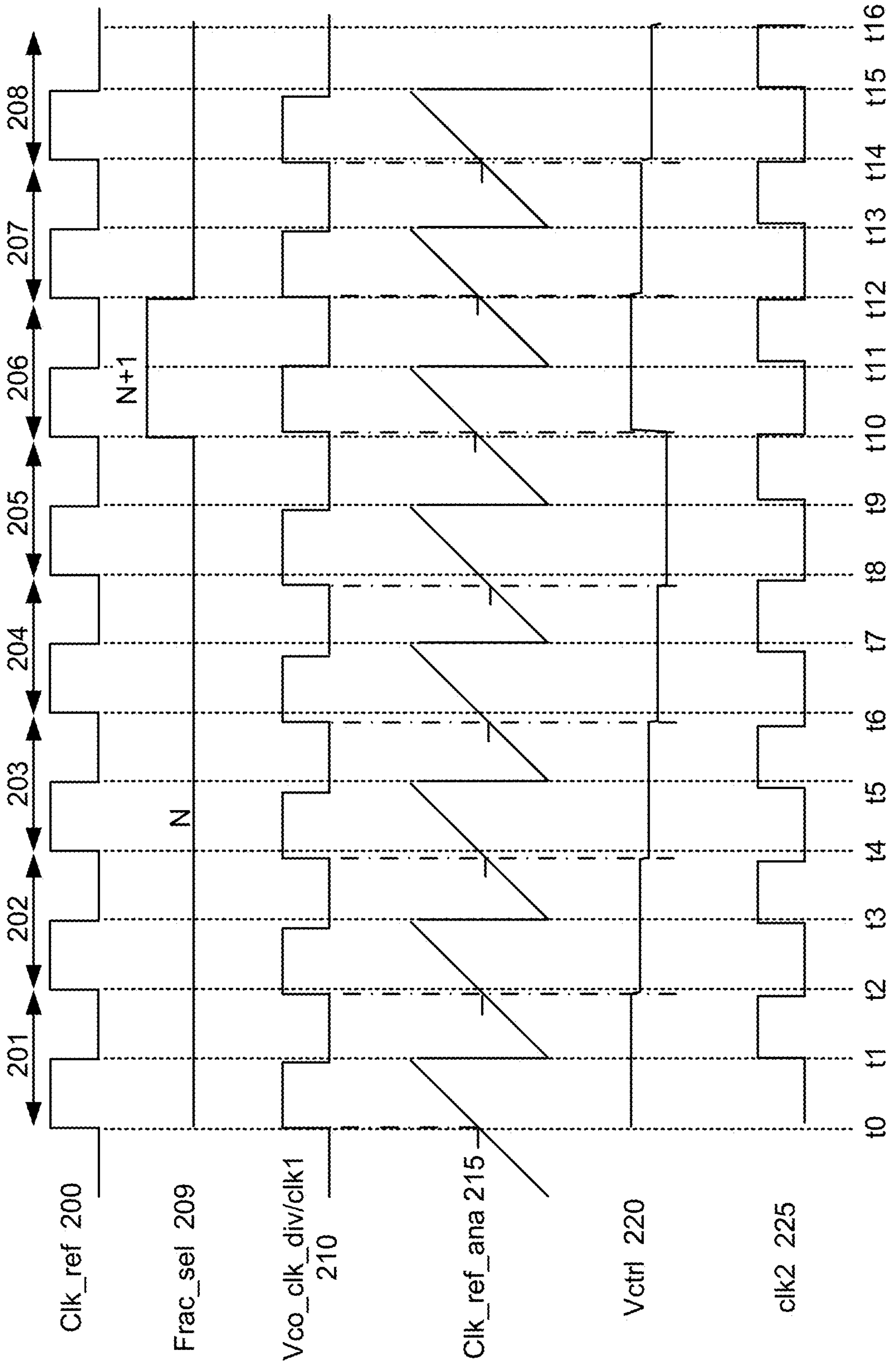
FIG. 2A depicts example waveforms consistent with the PLL 110 of FIG. 1A without the compensation circuit 150, showing how Vctrl (plot 220) varies in steps, in accordance with various embodiments.
Figure 2B:
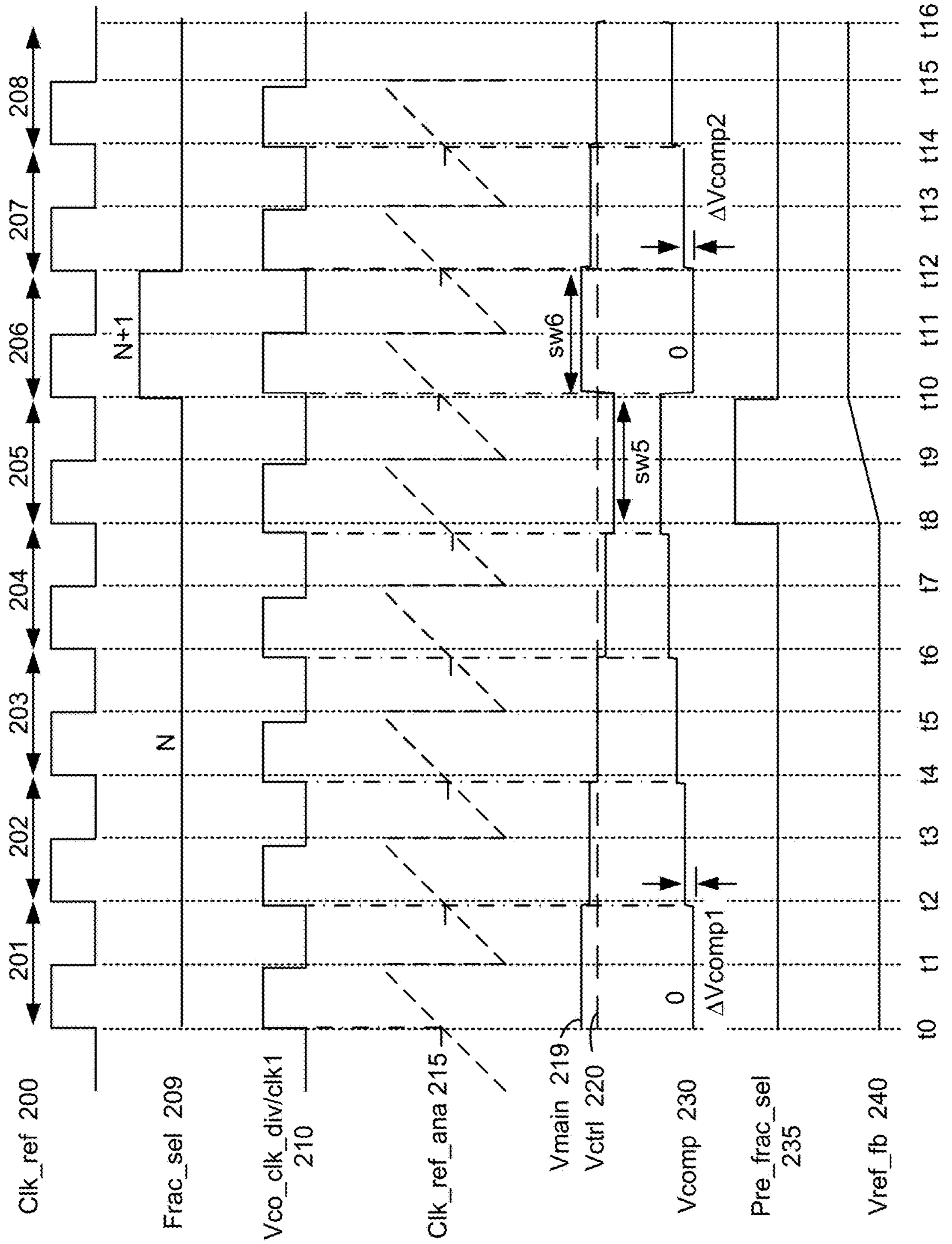
FIG. 2B depicts example waveforms consistent with the PLL 110 of FIG. 1B with the compensation circuit 150*a*, showing how Vctrl is stable, in accordance with various embodiments.

FIG. 1A depicts an example circuit 100 which includes a phase-locked loop (PLL) 110 and a compensation circuit 150, in accordance with various embodiments. The PLL receives a reference clock, Clk_ref, on an input path 111 and provides an output clock, Clk_out, on an output path 124. Clk_ref can be provided by a clock source such as a crystal oscillator. A crystal oscillator uses the mechanical resonance of a vibrating crystal of piezoelectric material to create a fixed frequency signal. Clk_ref can be a square wave (a digital waveform), for example, such as depicted in FIGS. 2A and 2B. A sawtooth generator converts Clk_ref to a sawtooth waveform Clk_ref_ana (denoting an analog signal) on a path 114. The sawtooth is one possible example of an analog waveform. The waveform may have an increasing portion which can be sampled.

Clk_ref_ana is input to a main sampler 115 to provide a corresponding output Vmain on a path 117. The main sampler includes a first switch sw1 which connects the path 114 to a path 116, where the path 116 is coupled to ground via a capacitor c1. The path 116 is also coupled to a second switch sw2 which is coupled to the path 117. The first and second switches sw1 and sw2 are controlled by first and second clock signals clk1 and clk2, respectively. These can be non-overlapping clock signals such as depicted in FIG. 2A. Clk2 can be essentially a signal which is opposite in phase to clk1, although a small timing gap is provided to ensure that clk1 is low when clk2 rises, and clk2 is low when clk1 rises.

When clk1 is high, sw1 is closed (conductive) to connect path 114 to path 116 and sw2 is open (non-conductive) to disconnect the path 116 from the path 117. As a result, the capacitor c2 can be charged based on the amplitude of Clk_ref_ana. When clk1 is low, sw1 is open to disconnect path 114 from path 116 and sw2 is closed to connect the path 116 to the path 117. As a result, the capacitor c2 can be discharged and transfer charge to the path 117 in a sample and hold operation. The main sampler 115 transfers charge from the path 114 to the path 116 and c1, and from the path 116 to the path 117, to provide Vmain.

Vmain on path 117 is a voltage signal of the PLL which is adjusted by a compensation circuit 150 for the PLL. The compensation circuit includes a ripple amplifier 180 and a ripple integrator 190. The ripple amplifier is responsive to the clock signals clk1 and clk2, a signal from the accumulator and a feedback signal from a ripple integrator. The ripple integrator is responsive to an output from the ripple amplifier and to signals from the accumulator, including Frac_sel. In particular, the ripple amplifier is coupled to the path 117 at a node 118. The ripple amplifier provides a compensation voltage, Vcomp, which is added to Vmain to provide a VCO control signal, Vctrl, on path 119 and node 118.

When the PLL is started, Vctrl=Vmain since Vcomp=0 V. The ripple amplifier amplifies ripples in Vctrl and provides the amplified output to the ripple integrator. The ripple integrator in turn provides a feedback signal to the ripple amplifier to provide Vcomp, which counteracts the ripple. For example, Vcomp can be a negative voltage when Vctrl is at a maximum and Vcomp can be a positive voltage when Vctrl is at a minimum.

Figure 1B:
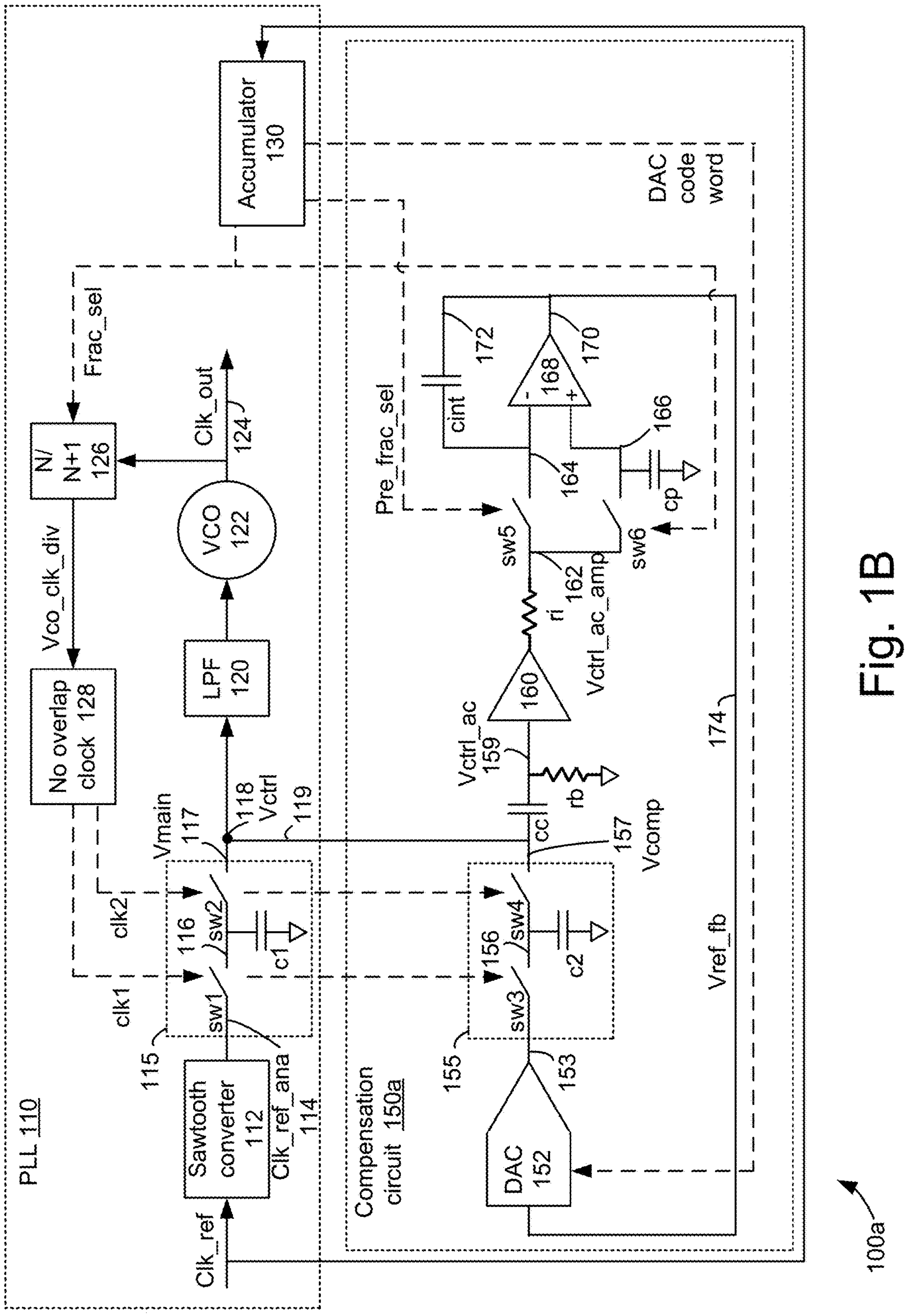
FIG. 1B depicts a circuit 100*a* which is an example implementation of the circuit 100 of FIG. 1A, in accordance with various embodiments.

An example implementation of the compensation circuit 150 is provided in FIG. 1B.

In the PLL, Vctrl is filtered at a low pass filter (LPF) 120, and the output of the LPF is provided to a voltage-controlled oscillator (VCO) 122. The VCO may be an analog oscillator, for example, which provides Clk_out on a path 124 based on the output from the LPF. Generally, when Vctrl is higher, the frequency of Clk_out will be higher.

Clk_out is also input to a fractional divider 126, which is an N/N+1 divider, in this example. Clk_out is divided in frequency by the divider to provide the divided clock signal, Vco_clk_div. The division is by an integer N for some cycles of Clk_out and by an integer N+1 for other cycles. For example, assume it is desired to provide Clk_out at a frequency (f)=10.01 GHz and that the frequency of Clk_ref is 100 MHz. In this case, Clk_out can be divided by 100 for nine cycles of divclk and by 101 for one cycle of divclk. On average, Clk_out is divided by 100.1, where 10.01 GHz/100.1=100 Mhz. This process is repeated in consecutive divide cycles, where a divide cycle comprises ten cycles of Clk_out in this example. A divide cycle can comprise multiple consecutive divisions by N and one division by N+1, in one example. With the fractional division, the frequency of Vco_clk_div, on average, matches the frequency of Clk_ref.

The fractional divider 126 is controlled by a signal Frac_sel from an accumulator 130. A transition in Frac_sel informs the divider to toggle its divisor between N and N+1. The accumulator is a circuit which can count the number of clock cycles of Clk_ref to set Frac_sel. For example, after 10 clock cycles with a divisor of N, Frac_sel is set to change the divisor to N+1. After one cycle with the divisor N+1, Frac_sel is set to change the divisor to N, and so forth.

The accumulator can calculate the error in the clock cycle and accumulate it over time. When it overflows, the N+1 cycle is initiated.

Vco_clk_div is provided to the no overlap clock 128 to provide clk1 and clk2 as mentioned.

FIG. 1B depicts a circuit 100*a* which is an example implementation of the circuit 100 of FIG. 1A, in accordance with various embodiments. The PLL 110 of FIG. 1A is repeated. In the compensation circuit 150*a*, the ripple amplifier 180 of FIG. 1A is represented by a digital-to-analog converter (DAC) 152, a compensation sampler 155 (including switches sw3 and sw4 and a capacitor c2), a capacitor cc, a resistor rb coupled to ground, and a buffer amplifier 160. The ripple integrator 190 of FIG. 1A is represented by a resistor ri, switches sw5 and sw6 which provide voltages to inverting and non-inverting inputs, respectively, of an op amp 168, a capacitor cp coupled to ground, and a capacitive feedback path 172 from the output of the op amp to the inverting input via an integrating capacitor, cint.

The third and fourth switches, sw3 and sw4, respectively, receive the clock signals clk1 and clk2, respectively, so that sw1 and sw3 are open or closed together, and sw2 and sw4 are open or closed together. The compensation sampler 155 transfers charge from a path 153 to path 156 and c2, and from the path 156 to the path 157, to provide Vcomp. As mentioned, Vctrl is the sum of Vmain and Vcomp. Vctrl is provided across cc and on the path 159, which comprises an alternating current (AC) version of Vctrl, as the signal Vctrl_ac. This means the AC components (ripples) but not the DC components of Vctrl are input to the buffer amplifier 160. The output of the buffer amplifier at ri is an amplified version of Vctrl_ac, Vctrl_ac_amp at a node 162. Vctrl_ac_amp represents the amplified AC ripples of Vctrl, and is provided to the inverting input of the op amp at a path 164 when the fifth switch sw5 is closed, and to the non-inverting input of the op amp at a path 166 when the sixth switch sw6 is closed.

The switch sw5 is controlled by a signal Pre_frac_sel from the accumulator and the switch sw6 is controlled by the signal Frac_sel from the accumulator. Sw5 is closed when Pre_frac_sel is high, and sw6 is closed when Frac_sel is high, one clock cycle later. The accumulator also provides a DAC code word to the DAC 152 to control its output and instruct it to update Vcomp. The output of the op amp, Vref_fb, at a path 170 is provided to the DAC on a path 174 as an output of the ripple integrator. Vref_b is also fed back on a feedback path 172 which includes cint to the inverting input on path 164.

The ripple integrator integrates the difference between a value of Vctrl_ac_amp during Pre_frac_sel and a value of Vctrl_ac_amp during Frac_sel. Within a divide cycle of N+1 clock cycles, Vctrl_ac_amp is typically at a minimum during Pre_frac_sel, which is the Nth clock cycle, and at a maximum during Frac_sel, which is the N+1st clock cycle.

Generally, the architecture of the PLL and compensation circuit provide feedback spur cancellation. The architecture includes, in the PLL, a main sampler 115 having a switched capacitor (c1), and in the compensation circuit, a compensation sampler 155 having a switched capacitor (c2). In the PLL, the sawtooth converter 112 converts Clk_ref into a linear sawtooth waveform, Clk_ref_ana. Both samplers 115 and 155 are controlled by the divided VCO clock, clk1 and clk2. The sawtooth converter is an example of an analog converter.

The accumulator 130 generates the Frac_sel control signal to control the multi-modulator to divide the VCO clock either by N or by N+1.

The main sampler 115 samples the sawtooth to generate the VCO's control voltage, Vctrl. If the divided VCO's frequency is higher than the reference clock, at each sampling cycle, Vco_clk_div will lead Clk_ref. See also FIG. 2A at plot 215. Thus, the sampled Vctrl will be decreased, and vice versa. This Vctrl will adjust the average divided VCO's frequency to be same as the reference clock, to lock the PLL output frequency.

However, when fractional division is used, there is no fixed integer ratio between the VCO's frequency and the reference clock. The PLL acts as a multi modulator which periodically switches between N and N+1 modes, causing the sampling clock phase periodically to be either leading (e.g., in the N mode) or lagging (e.g., in the N+1 mode). The sampled Vctrl will have a periodic ripple and cause large spurs in the VCO clock. The narrow LPF can smooth out some of the ripple but the bandwidth can not to be too small, otherwise it may cause a long capture response time or even stability issues in the PLL.

This techniques disclosed herein can eliminate the spurs in the output clock spectrum using an accessary compensation sampling loop filter in the compensation circuit. The loop filter of the compensation circuit is in a negative ripple feedback loop so that it can automatically compensate the ripple in the main loop filter of the PLL. This is a better solution than an open loop architecture, for example, which requires either a narrow bandwidth main LPF (which may cause a slow capture response or stability issues) or careful matching/calibration compensation. Furthermore, the open loop architecture cannot track variations in the ripples of the main filter.

The compensation DAC 152 generates a reverse ripple which is sampled by the compensation sampler 155. The resulting compensation, Vcomp, is added to the main sampler's output, Vmain, to obtain Vctrl. The compensation amplitude is determined by a feedback reference voltage, Vref_fb, of the DAC. Ideally, when the DAC's reference voltage has the proper value, the compensation can make Vctrl completely flat, thereby eliminating the spurs in the VCO. See also FIG. 5.

Vctrl is AC coupled (by cc and rb) and buffered/amplified to provide Vctrl_ac, which is fed to the ripple integrator. The high pass corner frequency of cc and rb is set to be <fref/5, for example, so that it can almost pass the ripple without loss. Sw5 and sw6 are controlled by Pre_frac_sel and Frac_sel signals, respectively. Pre_frac_sel is one cycle ahead of Frac_sel and is aligned with the lowest value in the Vctrl ripple, while the Frac_sel is aligned with the highest value in the ripple. Thus, sw5 is closed when Pre_frac_sel is high, at the time of the lowest value, and sw6 is closed when Frac_sel is high, at the time of the highest value. In this approach, in a divide cycle or set of N+1 clock cycles, the ripple is sampled at the lowest value at the Nth clock cycle, and at the highest value in the next, N+1$^{st}$ clock cycle. By sampling at these two adjacent clock cycles, the largest delta between the highest and lowest values is obtained to provide the best indication of the magnitude of the ripple.

If the ripple exists (e.g., Vctrl is not flat), these two voltages will be different between these two phases. The ripple difference is integrated by the integrator into the capacitor Cint. The integrator's output, Vref_fb, is fed back to the compensation DAC as a reference. Thus, the DAC output compensation amplitude is adjusted until Vctrl is completely flat. Typically Vctrl will reach a positive voltage such as a few tenths of a Volt which is appropriate for driving the VCO at a desired level.

The DAC is responsive to a DAC code word from the accumulator. The DAC multiplies the analog reference, Vref_fb, by the DAC code word to provide an output, Vcomp, on the path 153. The accumulator may provide the DAC code word to the DAC when there is the transition from N to N+1, for instance. The DAC essentially sets the magnitude and polarity of Vcomp based on Vref_fb.

There is no need for common mode voltage matching between the main sampler's output and the compensation sampler's output because this is a Type I sampling PLL. Since the main sampler's capacitor, c1, is much larger than the compensation sampler's capacitor, c2, any common mode offset caused by the compensation sampler's output will be automatically corrected in the main sampler.

This example operates whenever there is a switch from N to N+1. In some cases, this can result in a long time to converge. One option is to take every reference clock edge and look at the ripple and integrate it. Another option is to take every ith reference clock edge and look at the ripple and integrate it, where N>i>1. Accordingly, various implementations are possible.

FIG. 2A depicts example waveforms consistent with the PLL 110 of FIG. 1A without the compensation circuit 150, showing how Vctrl (plot 220) varies in steps, in accordance with various embodiments. In FIGS. 2A and 2B, the vertical direction denotes voltage and the horizontal direction denotes time, with time points t0-t16. Additionally, there are 5 clock pulses with a divisor of N followed by one clock pulse with a divisor of N+1, in this simplified example. A corresponding example of a divide cycle includes clock cycles 201-206. The plot 200 depicts Clk_ref, which may be a square wave which rises at t0, t2, t4, t6, t8, t10, t12 and t14 and falls at t1, t3, t5, t7, t9, t11, t13 and t15. Clk_ref extends over clock cycles 201-208. The plot 209 depicts Frac_sel which has the value N in clock cycles 201-205, N+1 in clock cycles 206, and N in clock cycles 207 and 208. The plot 210 depicts Vco_clk_div which is the same as clk1 in this example. Vco_clk_div is aligned with Clk_ref for clock cycle 210 but gradually begins to lead Clk_ref in clock cycles 202-205. In the N+1 mode, Vco_clk_div lags Clk_ref for clock cycle 206. With the return to the N mode, Vco_clk_div is aligned with Clk_ref in clock cycle 207 and begins to lead Clk_ref in clock cycle 208.

The plot 215 depicts Clk_ref_ana. The amplitude of this plot is enlarged relative to Clk_ref to show detail. Clk_ref_ana is sampled onto the capacitor c1 when Vco_clk_div/clk1 rises at the time indicated by the vertical dot-dash lines. The level at which Clk_ref_ana is sampled is denoted by a short horizontal line. It can be seen that Clk_ref_ana is sampled at decreasing levels for clock cycles 201-205, at a stepped up level for clock cycle 206, and at decreasing levels for clock cycle 207. As mentioned, Vctrl, and the corresponding frequency of the VCO output is an increasing function of the sampled level. The decrease in the sample level tends to counteract the leading of Vco_clk_div relative to Clk_ref.

In this example, since there is no compensation, Vctrl is substantially equal to the sampled level of Clk_ref_ana. Accordingly, Vctrl (plot 220) steps down in clock cycles 201-205, steps up in clock cycle 206 and steps down again in clock cycles 207 and 208.

The plot 225 depicts clk2 which is anti-phase relative to clk1.

FIG. 2B depicts example waveforms consistent with the PLL 110 of FIG. 1B with the compensation circuit 150_a_, showing how Vctrl is stable, in accordance with various embodiments. Clk_ref (plot 200), Frac_sel (plot 209), Vco_clk_div/clk1 (plot 210) and Clk_ref_ana (plot 215) of FIG. 2A are repeated. The plots 219 and 220 depict Vmain and Vctr, respectively. In clock cycle 205, sw5 is closed to sample Vctrl_ac_amp, and at clock cycle 206, sw6 is closed to sample Vctrl_ac_amp.

The stair step shape of Vmain is transformed to the stable waveform of Vctrl, due to the compensation of Vcomp (plot 230). Vcomp is a stepped waveform which increases in magnitude in successive clock cycles of Clk_ref. This stepped waveform is a mirror image of the output, Vmain, of the main sampler. In this example where a divide cycle include five clock cycles with division by N followed by one clock cycle with division by N+1, Vcomp steps up four times, in each of the second through Nth clock cycles.

In one approach, to compensate the output of the main sampler, the compensation circuit is to provide a stepped waveform which increases in magnitude in consecutive clock cycles, e.g., clock cycles 202-205, of the input reference clock signal.

As mentioned, Vctrl may be a positive voltage such as a few tenths of a Volt while Vcomp is smaller in magnitude, as the purpose of Vcomp is to cancel out ripples in Vmain. This cancelling is achieved when Vcomp has a shape which is essentially a mirror image of Vmain.

The plot 235 represents Pre_frac_sel. When Pre_frac_sel is high, the ripple integrator begins integrating to provide Vref_fb (plot 240) to the DAC. This integration is represented by a ramping up of Vref_fb from t6-t8.

ΔVcomp1 represents the step size of Vcomp in each successive clock cycle 201-205. After the clock cycle 206 in which the divisor is N+1. Vcomp may be reset to an initial value such as 0 V. Moreover, an updated value of the step size, e.g., ΔVcomp2, could be set by the DAC for use in the next set of N clock cycles including clock cycles 207 and 208.

In one approach, the integrator 190 is to sample a minima of the amplified ripples of Vctrl_ac_amp at an Nth clock cycle 205 of the PLL in a set of N+1 clock cycles, and to sample a maxima of the amplified ripples at an N+1st clock cycle 206 in the set of N+1 clock cycles.

More generally, the integrator is to sample the amplified ripples at one clock cycle in a set of clock cycles and to sample the amplified ripples at another clock cycle in the set of clock cycles.

The main sampler's output, Vmain, determines the absolute VCO's average frequency while the compensation output from DAC, Vcomp, compensates the ripple to suppress spurs. When they are combined, Vctrl becomes flat and the ripples and spurs are suppressed. The ripple compensation is automatically adjusted by the negative feedback mechanism and there is no need for calibration.

Ideally the compensated Vctrl will be flat and the spurs are eliminated. However, due to the nonlinearity of the compensation DAC, the differential nonlinearity (DNL) of the DAC may show as ripples on Vctrl and cause spurs in the VCO. In a worst scenario, the compensation DAC code falls on the largest DNL step, and the largest spur magnitude, Pr in dBc is given by:

$$P_r = 20\log\left(DNL\frac{k_{vco}}{2\omega_{ref}}\frac{SR}{f_{vco}}F_{LPF}(f_{ref})\right)$$

where SR is the slew rate converted from the reference clock, Clk_ref, to the sawtooth waveform, CLk_ref_ana. Kvco is the VCO's control voltage to frequency gain in rad/V. FLPF(fref) is the PLL loop filter's transfer function.

Another possible spur leak can be caused by the limited gain of the op amp inside the ripple integrator. The residual ripple is:

$$\Delta v = \frac{2^n}{\mathrm{mod}\left(fw2^{n-1}\right)}\frac{SR}{f_{vco}}/A$$

where n is the bit width of the DAC, fw is the fraction word and A is the gain of the op amp. The corresponding spur is:

$$P_r = 20\log\left(\frac{k_{vco}\Delta v}{2\omega_{ref}}F_{LPF}(f_{ref})\right)$$

Figure 3A:
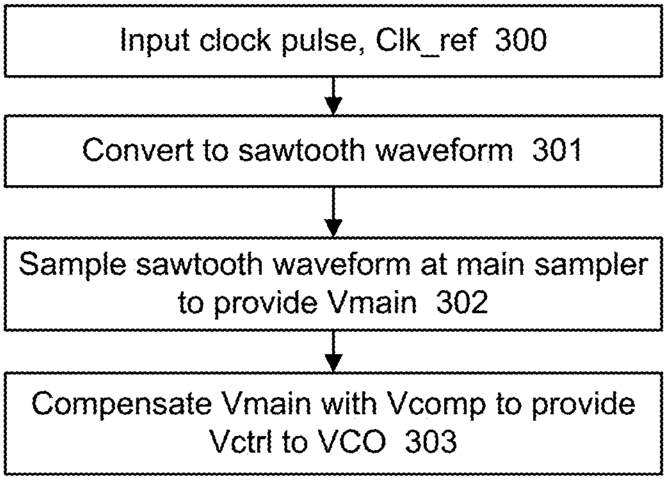
FIG. 3A depicts a flowchart of an example process at the PLL 110 of FIG. 1B, in accordance with various embodiments.

FIG. 3A depicts a flowchart of an example process at the PLL 110 of FIG. 1B, in accordance with various embodiments. At step 300, a clock pulse Clk_ref is input to the PLL. Step 301 includes converting the clock pulse to a sawtooth waveform or other analog waveform. Step 302 includes sampling the sawtooth waveform at the main sampler to provide Vmain. Step 303 includes compensating Vmain with Vcomp to provide Vctrl to the VCO.

Figure 3B:
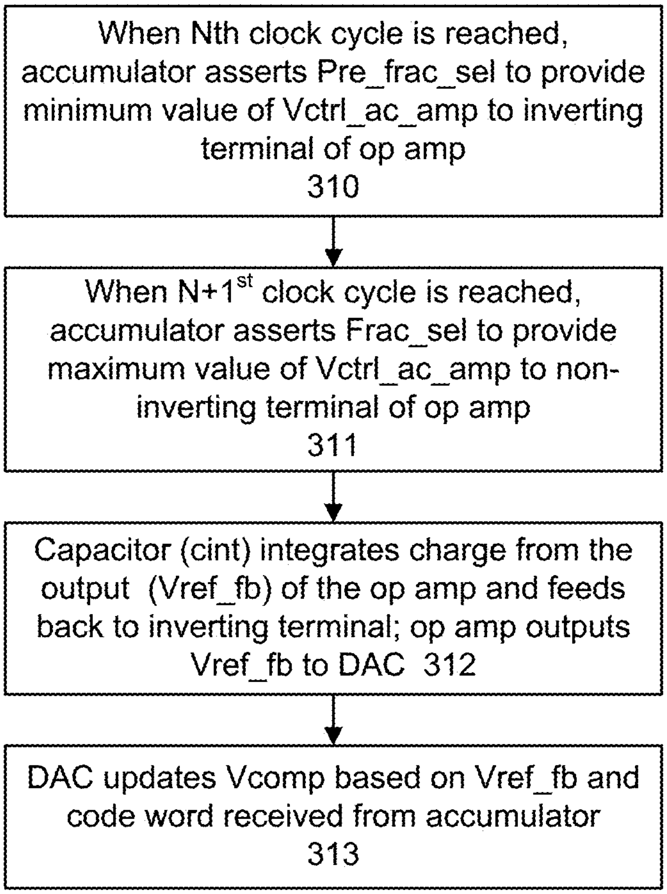
FIG. 3B depicts a flowchart of an example process at the compensation circuit 150*a* of FIG. 1B, in accordance with various embodiments.

FIG. 3B depicts a flowchart of an example process at the compensation circuit 150_a_ of FIG. 1B, in accordance with various embodiments. The process can be repeated for each divide cycle, in one approach. At step 310, when an Nth clock cycle is reached, the accumulator 130 asserts Pre_frac_sel to provide a minimum value of Vctrl_ac_amp to the inverting terminal 164 of the op amp 168. At step 311, when the N+1st clock cycle is reached, the accumulator asserts Frac_sel to provide a maximum value of Vctrl_ac_amp to the non-inverting terminal 166 of the op amp.

At step 312, the capacitor (cint) integrates charge from the output (Vref_fb) of the op amp and feeds back to inverting terminal. Also, the op amp outputs Vref_fb to the DAC. At step 313, the DAC updates Vcomp based on Vref_fb and a code word received from the accumulator. When the fractional divider is an N/N+1 divider, the DAC may receive the code word every N+1 clock cycles of the input reference clock signal., Clk_ref.

Figure 4:
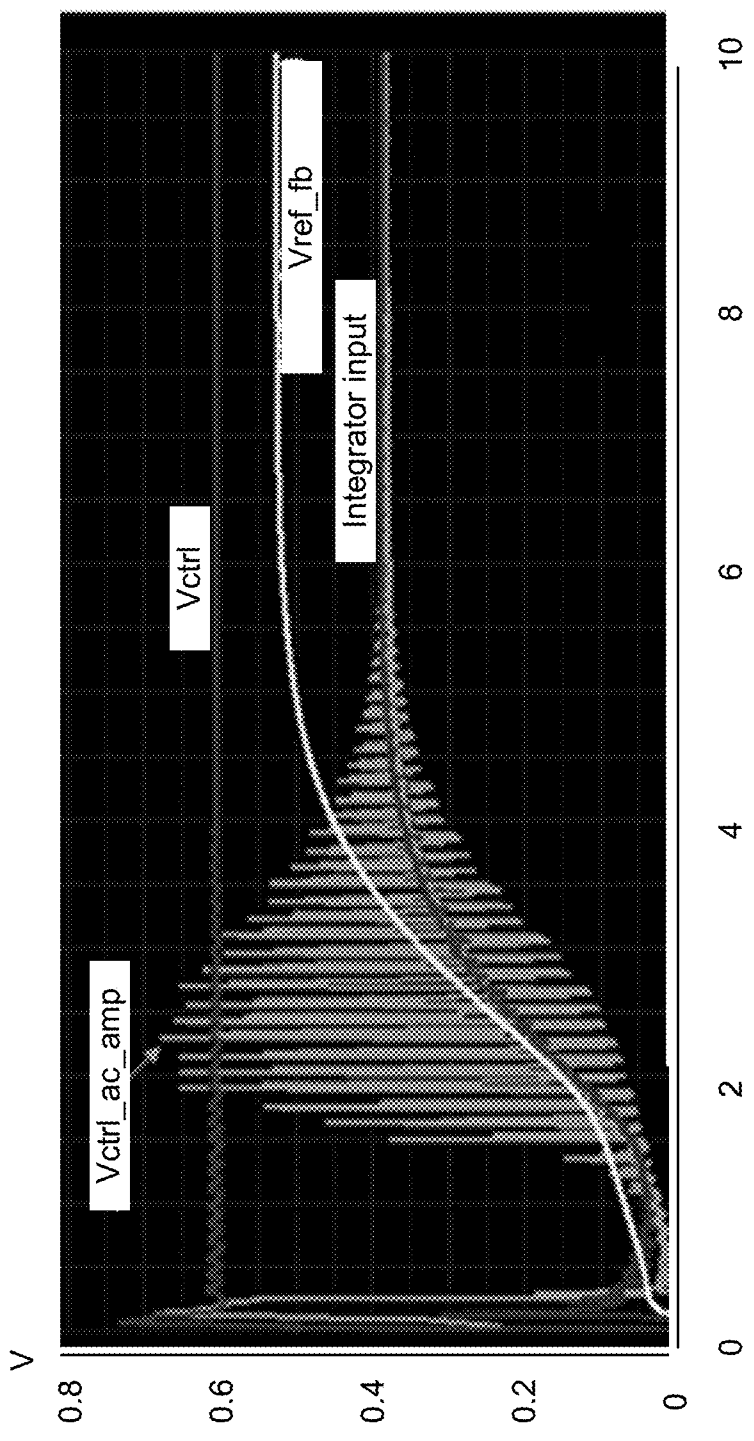
FIG. 4 depicts example waveforms from a simulation of the circuit 100*a* of FIG. 1B, showing how Vctrl becomes stable after starting up the PLL, in accordance with various embodiments.

FIG. 4 depicts example waveforms from a simulation of the circuit 100*a* of FIG. 1B, showing how Vctrl becomes stable after starting up the PLL, in accordance with various embodiments. The vertical axis depicts voltage and the horizontal axis depicts time in μs. When the PLL starts up, its frequency is quickly locked within 1 μs, as denoted by Vctrl. However, ripples are observed in Vctrl, primarily up until 4 μs, when the ripples are fully compensated by Vcomp to provide Vctrl at a fixed level. The magnitude of the ripples decreases gradually in this time period. Each visible ripple corresponds to the time period of N+1 clock cycles, for example.

Vctrl_ac_amp, which is based on amplifying Vctrl, oscillates significantly during this time period. These oscillations indicate strong spurs will be present in the spectrum of the VCO's clock.

Vref_fb and the integrator input both transition smoothly from initial levels to a steady final level. As the ripple integrator's output, Vref_fb, approaches its final value, the ripple in Vctrl converges to its final value, around 9 μs. Vctrl becomes smooth and flat, and the VCO's clock's spur is suppressed. Vctrl_ac_amp represents amplified ripples.

Figure 5:
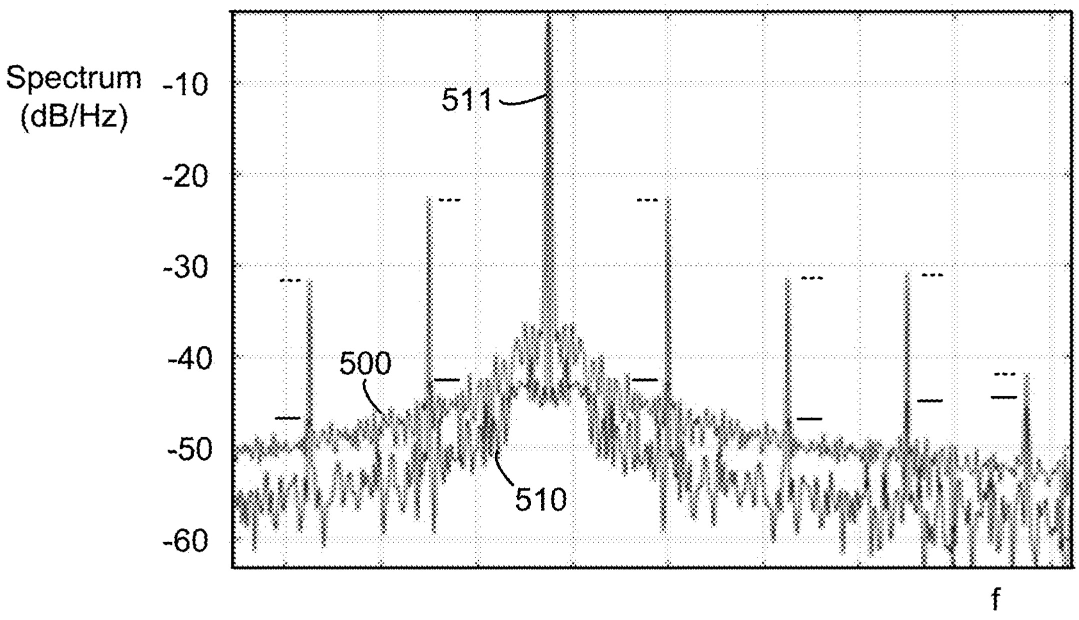
FIG. 5 depicts plots 500 and 510 of spectrum for the PLL 110 of FIG. 1B, with and without the compensation circuit 150*a*, respectively, in accordance with various embodiments.

FIG. 5 depicts plots 500 and 510 of spectrum for the PLL 110 of FIG. 1B, with and without the compensation circuit 150*a*, respectively, in accordance with various embodiments. The vertical axis depicts spectrum power in dB/Hz and the horizontal axis depicts frequency f. This is the spectrum of the PLL's output clock. When the compensation is not engaged (plot 510) there are strong spurs in the PLL output. When the compensation is used (plot 500), the spurs are suppressed at least 25 dB. The central peak 511 is common to both plots 500 and 510 and represents a desired operating frequency such as 2.4 GHz. Outside the central peak, the solid and dotted horizontal lines represent the amplitudes of the spurs with and without compensation, respectively. The solid line is lower than the dotted line for each spur indicating a substantial reduction in the spur.

Figure 6:
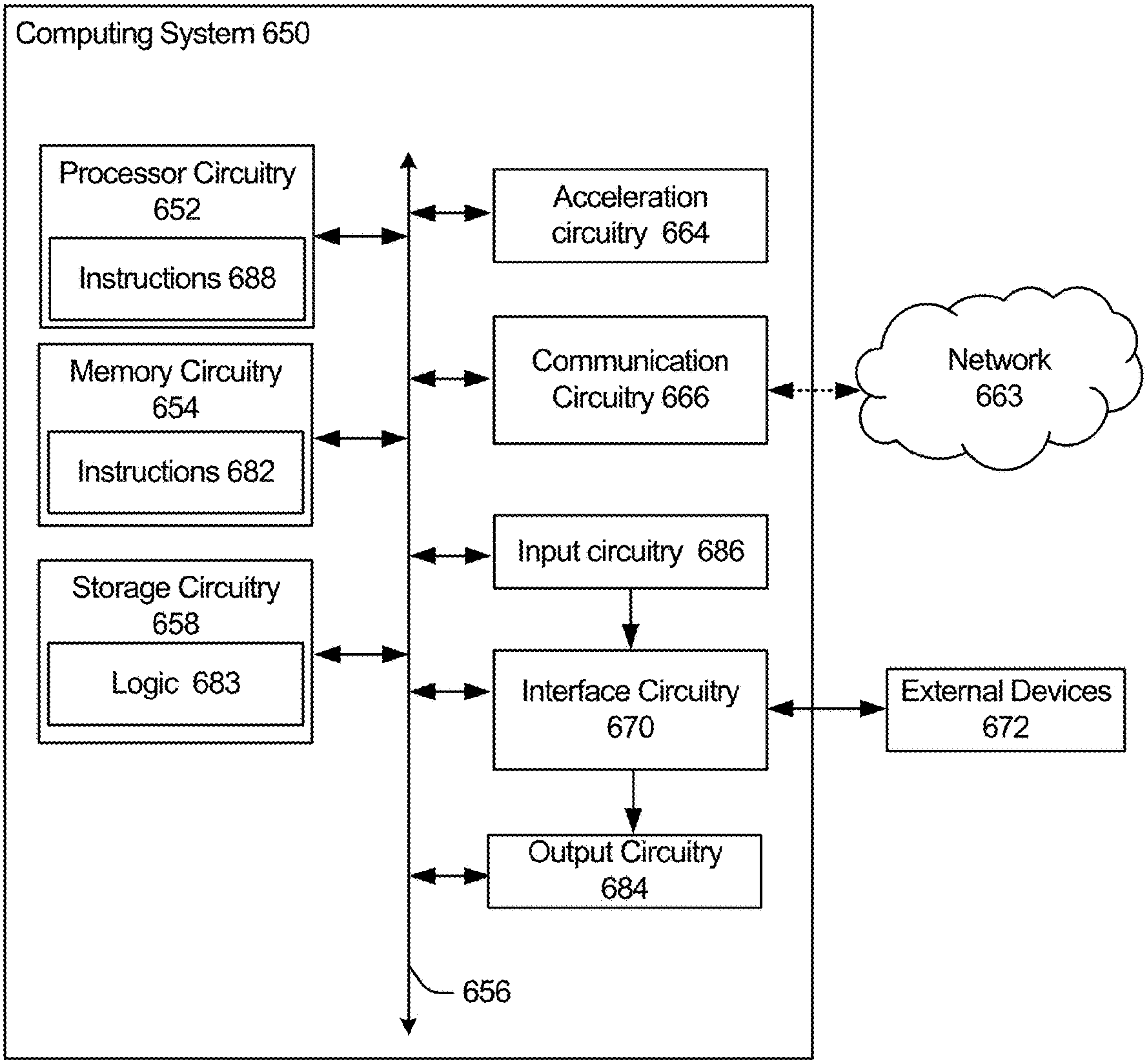
FIG. 6 illustrates an example of components that may be present in a computing system 650 for implementing the techniques (e.g., operations, processes, methods, and methodologies) described herein.

FIG. 6 illustrates an example of components that may be present in a computing system 650 for implementing the techniques (e.g., operations, processes, methods, and methodologies) described herein including the methods of the flowcharts of FIGS. 3A and 3B.

The PLL circuits 110 and 110*a* as described herein may be used in any of the components of the computing system. As mentioned, various applications of PLLs include demodulation of frequency-modulated (FM) and amplitude-modulated (AM) signals, use within a frequency synthesizer, signal recovery and in the distribution of precisely timed clock pulses in digital logic circuits and system, such as within a microprocessor system.

The computing system 650 may include any combinations of the hardware or logical components referenced herein. The components may be implemented as ICs, portions thereof, discrete electronic devices, or other modules, instruction sets, programmable logic or algorithms, hardware, hardware accelerators, software, firmware, or a combination thereof adapted in the computing system 650, or as components otherwise incorporated within a chassis of a larger system. For one embodiment, at least one processor 652 may be packaged together with computational logic 682 and configured to practice aspects of various example embodiments described herein to form a System in Package (SiP) or a System on Chip (SoC).

The system 650 includes processor circuitry in the form of one or more processors 652. The processor circuitry 652 includes circuitry such as, but not limited to one or more processor cores and one or more of cache memory, low drop-out voltage regulators (LDOs), interrupt controllers, serial interfaces such as SPI, I2C or universal programmable serial interface circuit, real time clock (RTC), timer-counters including interval and watchdog timers, general purpose I/O, memory card controllers such as secure digital/multi-media card (SD/MMC) or similar, interfaces, mobile industry processor interface (MIPI) interfaces and Joint Test Access Group (JTAG) test access ports. In some implementations, the processor circuitry 652 may include one or more hardware accelerators (e.g., same or similar to acceleration circuitry 664), which may be microprocessors, programmable processing devices (e.g., FPGA, ASIC, etc.), or the like. The one or more accelerators may include, for example, computer vision and/or deep learning accelerators. In some implementations, the processor circuitry 652 may include on-chip memory circuitry, which may include any suitable volatile and/or non-volatile memory, such as DRAM, SRAM, EPROM, EEPROM, Flash memory, solid-state memory, and/or any other type of memory device technology, such as those discussed herein The processor circuitry 652 may include, for example, one or more processor cores (CPUs), application processors, GPUs, RISC processors, Acorn RISC Machine (ARM) processors, CISC processors, one or more DSPs, one or more FPGAs, one or more PLDs, one or more ASICs, one or more baseband processors, one or more radio-frequency integrated circuits (RFIC), one or more microprocessors or controllers, a multi-core processor, a multithreaded processor, an ultra-low voltage processor, an embedded processor, or any other known processing elements, or any suitable combination thereof. The processors (or cores) 652 may be coupled with or may include memory/storage and may be configured to execute instructions stored in the memory/storage to enable various applications or operating systems to run on the platform 650. The processors (or cores) 652 is configured to operate application software to provide a specific service to a user of the platform 650. In some embodiments, the processor(s) 652 may be a special-purpose processor(s)/controller(s) configured (or configurable) to operate according to the various embodiments herein.

As examples, the processor(s) 652 may include an Intel® Architecture Core™ based processor such as an i3, an i5, an i7, an i9 based processor; an Intel® microcontroller-based processor such as a Quark™, an Atom™, or other MCU-based processor; Pentium® processor(s), Xeon® processor(s), or another such processor available from Intel® Corporation, Santa Clara, California. However, any number other processors may be used, such as one or more of Advanced Micro Devices (AMD) Zen® Architecture such as Ryzen® or EPYC® processor(s), Accelerated Processing Units (APUs), MxGPUs, Epyc® processor(s), or the like; A5-A12 and/or S1-S4 processor(s) from Apple® Inc., Snapdragon™ or Centrig™ processor(s) from Qualcomm® Technologies, Inc., Texas Instruments, Inc.® Open Multimedia Applications Platform (OMAP)™ processor(s); a MIPS-based design from MIPS Technologies, Inc. such as MIPS Warrior M-class, Warrior I-class, and Warrior P-class processors; an ARM-based design licensed from ARM Holdings, Ltd., such as the ARM Cortex-A, Cortex-R, and Cortex-M family of processors; the ThunderX2® provided by Cavium™, Inc.; or the like. In some implementations, the processor(s) 652 may be a part of a system on a chip (SoC), System-in-Package (SiP), a multi-chip package (MCP), and/or the like, in which the processor(s) 652 and other components are formed into a single integrated circuit, or a single package, such as the Edison™ or Galileo™ SoC boards from Intel® Corporation. Other examples of the processor(s) 652 are mentioned elsewhere in the present disclosure.

The system 650 may include or be coupled to acceleration circuitry 664, which may be embodied by one or more AI/ML accelerators, a neural compute stick, neuromorphic hardware, an FPGA, an arrangement of GPUs, one or more SoCs (including programmable SoCs), one or more CPUs, one or more digital signal processors, dedicated ASICs (including programmable ASICs), PLDs such as complex (CPLDs) or high complexity PLDs (HCPLDs), and/or other forms of specialized processors or circuitry designed to accomplish one or more specialized tasks. These tasks may include AI/ML processing (e.g., including training, inferencing, and classification operations), visual data processing, network data processing, object detection, rule analysis, or the like. In FPGA-based implementations, the acceleration circuitry 664 may comprise logic blocks or logic fabric and other interconnected resources that may be programmed (configured) to perform various functions, such as the procedures, methods, functions, etc. of the various embodiments discussed herein. In such implementations, the acceleration circuitry 664 may also include memory cells (e.g., EPROM, EEPROM, flash memory, static memory (e.g., SRAM, anti-fuses, etc.) used to store logic blocks, logic fabric, data, etc. in LUTs and the like.

In some implementations, the processor circuitry 652 and/or acceleration circuitry 664 may include hardware elements specifically tailored for machine learning and/or artificial intelligence (AI) functionality. In these implementations, the processor circuitry 652 and/or acceleration circuitry 664 may be, or may include, an AI engine chip that can run many different kinds of AI instruction sets once loaded with the appropriate weightings and training code. Additionally or alternatively, the processor circuitry 652 and/or acceleration circuitry 664 may be, or may include, AI accelerator(s), which may be one or more of the aforementioned hardware accelerators designed for hardware acceleration of AI applications. As examples, these processor(s) or accelerators may be a cluster of artificial intelligence (AI) GPUs, tensor processing units (TPUs) developed by Google® Inc., Real AI Processors (RAPs™) provided by AlphaICs®, Nervana™ Neural Network Processors (NNPs) provided by Intel® Corp., Intel® Movidius™ Myriad™ X Vision Processing Unit (VPU), NVIDIA® PX™ based GPUs, the NM500 chip provided by General Vision®, Hardware 3 provided by Tesla®, Inc., an Epiphany™ based processor provided by Adapteva®, or the like. In some embodiments, the processor circuitry 652 and/or acceleration circuitry 664 and/or hardware accelerator circuitry may be implemented as AI accelerating co-processor(s), such as the Hexagon 685 DSP provided by Qualcomm®, the PowerVR 2NX Neural Net Accelerator (NNA) provided by Imagination Technologies Limited®, the Neural Engine core within the Apple® A11 or A12 Bionic SoC, the Neural Processing Unit (NPU) within the HiSilicon Kirin 970 provided by Huawei®, and/or the like. In some hardware-based implementations, individual subsystems of system 650 may be operated by the respective AI accelerating co-processor(s), AI GPUs, TPUs, or hardware accelerators (e.g., FPGAs, ASICs, DSPs, SoCs, etc.), etc., that are configured with appropriate logic blocks, bit stream(s), etc. to perform their respective functions.

The system 650 also includes system memory 654. Any number of memory devices may be used to provide for a given amount of system memory. As examples, the memory 654 may be, or include, volatile memory such as random access memory (RAM), static RAM (SRAM), dynamic RAM (DRAM), synchronous DRAM (SDRAM), RAMBUS® Dynamic Random Access Memory (RDRAM®), and/or any other desired type of volatile memory device. Additionally or alternatively, the memory 654 may be, or include, non-volatile memory such as read-only memory (ROM), erasable programmable ROM (EPROM), electrically erasable programmable (EEPROM), flash memory, non-volatile RAM, ferroelectric RAM, phase-change memory (PCM), flash memory, and/or any other desired type of non-volatile memory device. Access to the memory 654 is controlled by a memory controller. The individual memory devices may be of any number of different package types such as single die package (SDP), dual die package (DDP) or quad die package (Q17P). Any number of other memory implementations may be used, such as dual inline memory modules (DIMMs) of different varieties including but not limited to microDIMMs or MiniDIMMs.

Storage circuitry 658 provides persistent storage of information such as data, applications, operating systems and so forth. In an example, the storage 658 may be implemented via a solid-state disk drive (SSDD) and/or high-speed electrically erasable memory (commonly referred to as "flash memory"). Other devices that may be used for the storage 658 include flash memory cards, such as SD cards, microSD cards, XD picture cards, and the like, and USB flash drives. In an example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, phase change RAM (PRAM), resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a Domain Wall (DW) and Spin Orbit Transfer (SOT) based device, a thyristor based memory device, a hard disk drive (HDD), micro HDD, of a combination thereof, and/or any other memory. The memory circuitry 654 and/or storage circuitry 658 may also incorporate three-dimensional (3D) cross-point (XPOINT) memories from Intel® and Micron®.

The memory circuitry 654 and/or storage circuitry 658 is/are configured to store computational logic 683 in the form of software, firmware, microcode, or hardware-level instructions to implement the techniques described herein. The computational logic 683 may be employed to store working copies and/or permanent copies of programming instructions, or data to create the programming instructions, for the operation of various components of system 650 (e.g., drivers, libraries, application programming interfaces (APIs), etc.), an operating system of system 650, one or more applications, and/or for carrying out the embodiments discussed herein. The computational logic 683 may be stored or loaded into memory circuitry 654 as instructions 682, or data to create the instructions 682, which are then accessed for execution by the processor circuitry 652 to carry out the functions described herein. The processor circuitry 652 and/or the acceleration circuitry 664 accesses the memory circuitry 654 and/or the storage circuitry 658 over the interconnect (IX) 656. The instructions 682 direct the processor circuitry 652 to perform a specific sequence or flow of actions, for example, as described with respect to flowchart(s) and block diagram(s) of operations and functionality depicted previously. The various elements may be implemented by assembler instructions supported by processor circuitry 652 or high-level languages that may be compiled into instructions 688, or data to create the instructions 688, to be executed by the processor circuitry 652. The permanent copy of the programming instructions may be placed into persistent storage devices of storage circuitry 658 in the factory or in the field through, for example, a distribution medium (not shown), through a communication interface (e.g., from a distribution server (not shown)), over-the-air (OTA), or any combination thereof.

The IX 656 couples the processor 652 to communication circuitry 666 for communications with other devices, such as a remote server (not shown) and the like. The communication circuitry 666 is a hardware element, or collection of hardware elements, used to communicate over one or more networks 663 and/or with other devices. In one example, communication circuitry 666 is, or includes, transceiver circuitry configured to enable wireless communications using any number of frequencies and protocols such as, for example, the Institute of Electrical and Electronics Engineers (IEEE) 802.11 (and/or variants thereof), IEEE 802.23.4, Bluetooth® and/or Bluetooth® low energy (BLE), ZigBee®, LoRaWAN™ (Long Range Wide Area Network), a cellular protocol such as 3GPP LTE and/or Fifth Generation (5G)/New Radio (NR), and/or the like. Additionally or alternatively, communication circuitry 666 is, or includes, one or more network interface controllers (NICs) to enable wired communication using, for example, an Ethernet connection, Controller Area Network (CAN), Local Interconnect Network (LIN), DeviceNet, ControlNet, Data Highway+, or PROFINET, among many others.

The IX 656 also couples the processor 652 to interface circuitry 670 that is used to connect system 650 with one or more external devices 672. The external devices 672 may include, for example, sensors, actuators, positioning circuitry (e.g., global navigation satellite system (GNSS)/Global Positioning System (GPS) circuitry), client devices, servers, network appliances (e.g., switches, hubs, routers, etc.), integrated photonics devices (e.g., optical neural network (ONN) integrated circuit (IC) and/or the like), and/or other like devices.

In some optional examples, various input/output (I/O) devices may be present within or connected to, the system 650, which are referred to as input circuitry 686 and output circuitry 684. The input circuitry 686 and output circuitry 684 include one or more user interfaces designed to enable user interaction with the platform 650 and/or peripheral component interfaces designed to enable peripheral component interaction with the platform 650. Input circuitry 686 may include any physical or virtual means for accepting an input including, inter alia, one or more physical or virtual buttons (e.g., a reset button), a physical keyboard, keypad, mouse, touchpad, touchscreen, microphones, scanner, headset, and/or the like. The output circuitry 684 may be included to show information or otherwise convey information, such as sensor readings, actuator position(s), or other like information. Data and/or graphics may be displayed on one or more user interface components of the output circuitry 684. Output circuitry 684 may include any number and/or combinations of audio or visual display, including, inter alia, one or more simple visual outputs/indicators (e.g., binary status indicators (e.g., light emitting diodes (LEDs)) and multi-character visual outputs, or more complex outputs such as display devices or touchscreens (e.g., Liquid Crystal Displays (LCD), LED displays, quantum dot displays, projectors, etc.), with the output of characters, graphics, multimedia objects, and the like being generated or produced from the operation of the platform 650. The output circuitry 684 may also include speakers and/or other audio emitting devices, printer(s), and/or the like. Additionally or alternatively, sensor(s) may be used as the input circuitry 684 (e.g., an image capture device, motion capture device, or the like) and one or more actuators may be used as the output device circuitry 684 (e.g., an actuator to provide haptic feedback or the like). Peripheral component interfaces may include, but are not limited to, a non-volatile memory port, a USB port, an audio jack, a power supply interface, etc. In some embodiments, a display or console hardware, in the context of the present system, may be used to provide output and receive input of an edge computing system; to manage components or services of an edge computing system; identify a state of an edge computing component or service; or to conduct any other number of management or administration functions or service use cases.

The components of the system 650 may communicate over the IX 656. The IX 656 may include any number of technologies, including ISA, extended ISA, I2C, SPI, point-to-point interfaces, power management bus (PMBus), PCI, PCIe, PCIx, Intel® UPI, Intel® Accelerator Link, Intel® CXL, CAPI, OpenCAPI, Intel® QPI, UPI, Intel® OPA IX, RapidIO™ system IXs, CCIX, Gen-Z Consortium IXs, a HyperTransport interconnect, NVLink provided by NVIDIA®, a Time-Trigger Protocol (TTP) system, a FlexRay system, PROFIBUS, and/or any number of other IX technologies. The IX 656 may be a proprietary bus, for example, used in a SoC based system.

The number, capability, and/or capacity of the elements of system 650 may vary, depending on whether computing system 650 is used as a stationary computing device (e.g., a server computer in a data center, a workstation, a desktop computer, etc.) or a mobile computing device (e.g., a smartphone, tablet computing device, laptop computer, game console, IoT device, etc.). In various implementations, the computing device system 650 may comprise one or more components of a data center, a desktop computer, a workstation, a laptop, a smartphone, a tablet, a digital camera, a smart appliance, a smart home hub, a network appliance, and/or any other device/system that processes data.

The techniques described herein can be performed partially or wholly by software or other instructions provided in a machine-readable storage medium (e.g., memory). The software is stored as processor-executable instructions (e.g., instructions to implement any other processes discussed herein). Instructions associated with the flowchart (and/or various embodiments) and executed to implement embodiments of the disclosed subject matter may be implemented as part of an operating system or a specific application, component, program, object, module, routine, or other sequence of instructions or organization of sequences of instructions.

The storage medium can be a tangible machine readable medium such as read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs)), among others.

The storage medium may be included, e.g., in a communication device, a computing device, a network device, a personal digital assistant, a manufacturing tool, a mobile communication device, a cellular phone, a notebook computer, a tablet, a game console, a set top box, an embedded system, a TV (television), or a personal desktop computer.

Some non-limiting examples of various embodiments are presented below.

Example 1 includes an apparatus, comprising: a phase-locked loop (PLL) comprising a converter to provide an analog waveform from an input reference clock signal, a main sampler coupled to the converter to sample the analog waveform, a voltage-controlled oscillator (VCO) coupled to the main sampler, and a fractional divider coupled to the VCO; and a compensation circuit coupled to the PLL, the compensation circuit is to compensate an output of the main sampler to provide a compensated control signal for the VCO.

Example 2 includes the apparatus of Example 1, wherein to compensate the output of the main sampler, the compensation circuit is to provide a stepped waveform which increases in magnitude in consecutive clock cycles of the input reference clock signal.

Example 3 include the apparatus of claim 2, wherein the stepped waveform is a mirror image of the output of the main sampler.

Example 4 include the apparatus of any one of Examples 1 to 3, wherein the PLL further comprises a no overlap clock coupled to the fractional divider, the no overlap clock is to provide a first clock signal and a second clock signal to control respective switches in the main sampler to provide a sample and hold capability for the main sampler.

Example 5 include the apparatus of Example 4, wherein a phase of the first clock signal is opposite to a phase of the second clock signal.

Example 6 include the apparatus of Example 4 or 5, wherein the compensation circuit comprises a digital-to-analog converter (DAC) and a compensation sampler coupled to an output of the DAC, the compensation sampler is to sample the output of the DAC, and an output of the compensation sampler is coupled to the output of the main sampler.

Example 7 include the apparatus of Example 6, wherein the first clock signal and the second clock signal are to control respective switches in the compensation sampler to provide a sample and hold capability for the compensation sampler.

Example 8 include the apparatus of Example 6 or 7, wherein the compensation circuit comprises an amplifier to amplify an output of the compensation sampler and an integrator to integrate an output of the amplifier.

Example 9 include the apparatus of Example 8, wherein the integrator is to provide a feedback signal to the DAC and the DAC is to adjust its output based on the feedback signal.

Example 10 include the apparatus of Example 8 or 9, wherein the integrator is to sample a minima of the output of the amplifier at an Nth clock cycle in a set of N+1 clock cycles, and to sample a maxima of the output of the amplifier at an N+1st clock cycle in the set of N+1 clock cycles.

Example 11 include the apparatus of Example 10, wherein the integrator comprises an operational amplifier having an inverting input and a non-inverting input, and a capacitive feedback path from the output to the inverting input, and the integrator is to sample the minima to the inverting input and to sample the maxima to the non-inverting input.

Example 12 include the apparatus of any one of Examples 1 to 11, wherein the compensation circuit comprises a digital-to-analog converter (DAC) and a compensation sampler coupled to an output of the DAC, the compensation sampler is to sample the output of the DAC, an output of the compensation sampler is coupled to the output of the main sampler, and the DAC is to receive a code word which instructs the DAC to update its output.

Example 13 include the apparatus of Example 12, wherein the fractional divider is an N/N+1 divider, and the DAC is to receive the code word every N+1 clock cycles of the input reference clock signal.

Example 14 include a compensation circuit for a phase-locked loop (PLL), the compensation circuit comprising: a digital-to-analog converter (DAC); a compensation sampler coupled to an output of the DAC, wherein the compensation sampler is to sample the output of the DAC, and an output of the compensation sampler is coupled to the PLL to provide a compensated control signal for a voltage-controlled oscillator (VCO) of the PLL; an amplifier to amplify ripples in the compensated control signal, to provide amplified ripples; an integrator to integrate the amplified ripples; and a feedback path from an output of the integrator to the DAC, wherein the DAC is to update its output based on a feedback signal on the feedback path.

Example 15 include the apparatus of Example 14, wherein the integrator is to sample a minima of the amplified ripples at an Nth clock cycle of the PLL in a set of N+1 clock cycles, and to sample a maxima of the amplified ripples at an N+1st clock cycle in the set of N+1 clock cycles.

Example 16 include the apparatus of Example 15, wherein the integrator comprises an operational amplifier having an inverting input and a non-inverting input, and a capacitive feedback path from the output to the inverting input, and the integrator is to sample the minima to the inverting input and to sample the maxima to the non-inverting input.

Example 17 include the apparatus of any one of Examples 14 to 16, wherein the integrator is to sample the amplified ripples at one clock cycle in a set of clock cycles and to sample the amplified ripples at another clock cycle in the set of clock cycles.

Example 18 includes an apparatus, comprising: a phase-locked loop (PLL) comprising a converter to provide an analog waveform from an input reference clock signal, a main sampler coupled to the converter to sample the analog waveform, a voltage-controlled oscillator (VCO) coupled to the main sampler, a fractional divider coupled to the VCO, and a clock coupled to the fractional divider, wherein the clock is to provide clock signals to control respective switches in the main sampler to provide a sample and hold capability for the main sampler; and a compensation circuit coupled to the PLL, wherein the compensation circuit comprises a digital-to-analog converter (DAC), and a compensation sampler coupled to an output of the DAC, the compensation sampler is to sample the output of the DAC, an output of the compensation sampler is coupled to the output of the main sampler to compensate an output of the main sampler to provide a compensated control signal for the VCO, and the clock signals are to control respective switches in the compensation sampler to provide a sample and hold capability for the compensation sampler.

Example 19 includes the apparatus of Example 18, wherein the compensation circuit further comprises an amplifier to amplify ripples in the compensated control signal, to provide amplified ripples, an integrator to integrate the amplified ripples, and a feedback path from an output of the integrator to the DAC, and the DAC is to update its output based on a feedback signal on the feedback path.

Example 20 includes the apparatus of Example 19, wherein the fractional divider is an N/N+1 divider, and the DAC is to receive a code word every N+1 clock cycles of the input reference clock signal, and the code word instructs the DAC to update its output.

In the present detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The terms "coupled," "communicatively coupled," along with derivatives thereof are used herein. The term "coupled" may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" may mean that two or more elements are in direct contact with one another. The term "communicatively coupled" may mean that two or more elements may be in contact with one another by a means of communication including through a wire or other interconnect connection, through a wireless communication channel or link, and/or the like.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:

a phase-locked loop (PLL) comprising a converter to provide an analog waveform from an input reference clock signal, a main sampler coupled to the converter to sample the analog waveform, a voltage-controlled oscillator (VCO) coupled to the main sampler, and a fractional divider coupled to the VCO; and a compensation circuit coupled to the PLL, the compensation circuit is to compensate an output of the main sampler to provide a compensated control signal for the VCO, wherein to compensate the output of the main sampler, the compensation circuit is to provide a stepped waveform which increases in magnitude in consecutive clock cycles of the input reference clock signal.

2. The apparatus of claim 1, wherein the stepped waveform is a mirror image of the output of the main sampler.

3. The apparatus of claim 1, wherein the PLL further comprises a no overlap clock coupled to the fractional divider, the no overlap clock is to provide a first clock signal and a second clock signal to control respective switches in the main sampler to provide a sample and hold capability for the main sampler.

4. The apparatus of claim 3, wherein a phase of the first clock signal is opposite to a phase of the second clock signal.

5. The apparatus of claim 3, wherein the compensation circuit comprises a digital-to-analog converter (DAC) and a compensation sampler coupled to an output of the DAC, the compensation sampler is to sample the output of the DAC, and an output of the compensation sampler is coupled to the output of the main sampler.

6. The apparatus of claim 5, wherein the first clock signal and the second clock signal are to control respective switches in the compensation sampler to provide a sample and hold capability for the compensation sampler.

7. The apparatus of claim 5, wherein the compensation circuit comprises an amplifier to amplify an output of the compensation sampler and an integrator to integrate an output of the amplifier.

8. The apparatus of claim 7, wherein the integrator is to provide a feedback signal to the DAC and the DAC is to adjust its output based on the feedback signal.

9. The apparatus of claim 7, wherein the integrator is to sample a minima of the output of the amplifier at an Nth clock cycle in a set of N+1 clock cycles, and to sample a maxima of the output of the amplifier at an $N+1^{st}$ clock cycle in the set of N+1 clock cycles.

10. The apparatus of claim 9, wherein the integrator comprises an operational amplifier having an inverting input and a non-inverting input, and a capacitive feedback path from the output to the inverting input, and the integrator is to sample the minima to the inverting input and to sample the maxima to the non-inverting input.

11. The apparatus of claim 1, wherein the compensation circuit comprises a digital-to-analog converter (DAC) and a compensation sampler coupled to an output of the DAC, the compensation sampler is to sample the output of the DAC, an output of the compensation sampler is coupled to the output of the main sampler, and the DAC is to receive a code word which instructs the DAC to update its output.

12. The apparatus of claim 11, wherein the fractional divider is an N/N+1 divider, and the DAC is to receive the code word every N+1 clock cycles of the input reference clock signal.

13. A compensation circuit for a phase-locked loop (PLL), the compensation circuit comprising:

a digital-to-analog converter (DAC);

a compensation sampler coupled to an output of the DAC, wherein the compensation sampler is to sample the output of the DAC, and an output of the compensation sampler is coupled to the PLL to provide a compensated control signal for a voltage-controlled oscillator (VCO) of the PLL;

an amplifier to amplify ripples in the compensated control signal, to provide amplified ripples;

an integrator to integrate the amplified ripples; and a feedback path from an output of the integrator to the DAC, wherein the DAC is to update its output based on a feedback signal on the feedback path.

14. The compensation circuit of claim 13, wherein the integrator is to sample a minima of the amplified ripples at an Nth clock cycle of the PLL in a set of N+1 clock cycles, and to sample a maxima of the amplified ripples at an $N+1^{st}$ clock cycle in the set of N+1 clock cycles.

15. The compensation circuit of claim 14, wherein the integrator comprises an operational amplifier having an inverting input and a non-inverting input, and a capacitive feedback path from the output to the inverting input, and the integrator is to sample the minima to the inverting input and to sample the maxima to the non-inverting input.

16. The compensation circuit of claim 13, wherein the integrator is to sample the amplified ripples at one clock cycle in a set of clock cycles and to sample the amplified ripples at another clock cycle in the set of clock cycles.

17. An apparatus, comprising:

a phase-locked loop (PLL) comprising a converter to provide an analog waveform from an input reference clock signal, a main sampler coupled to the converter to sample the analog waveform, a voltage-controlled oscillator (VCO) coupled to the main sampler, a fractional divider coupled to the VCO, and a clock coupled to the fractional divider, wherein the clock is to provide clock signals to control respective switches in the main sampler to provide a sample and hold capability for the main sampler; and a compensation circuit coupled to the PLL, wherein the compensation circuit comprises a digital-to-analog converter (DAC), and a compensation sampler coupled to an output of the DAC, the compensation sampler is to sample the output of the DAC, an output of the compensation sampler is coupled to the output of the main sampler to compensate an output of the main sampler to provide a compensated control signal for the VCO, and the clock signals are to control respective switches in the compensation sampler to provide a sample and hold capability for the compensation sampler.

18. The apparatus of claim 17, wherein the compensation circuit further comprises an amplifier to amplify ripples in the compensated control signal, to provide amplified ripples, an integrator to integrate the amplified ripples, and a feedback path from an output of the integrator to the DAC, and the DAC is to update its output based on a feedback signal on the feedback path.

19. The apparatus of claim 18, wherein the fractional divider is an N/N+1 divider, and the DAC is to receive a code word every N+1 clock cycles of the input reference clock signal, and the code word instructs the DAC to update its output.

* * * * *